(12) United States Patent
Ueno et al.

(10) Patent No.: US 11,333,123 B2
(45) Date of Patent: May 17, 2022

(54) SEMICONDUCTOR DEVICE

(71) Applicant: Mitsubishi Electric Corporation, Tokyo (JP)

(72) Inventors: Makoto Ueno, Fukuoka (JP); Kazuhiro Nishimura, Fukuoka (JP); Koji Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 50 days.

(21) Appl. No.: 16/756,110

(22) PCT Filed: Feb. 9, 2018

(86) PCT No.: PCT/JP2018/004641
§ 371 (c)(1),
(2) Date: Apr. 14, 2020

(87) PCT Pub. No.: WO2019/155613
PCT Pub. Date: Aug. 15, 2019

(65) Prior Publication Data
US 2020/0240385 A1 Jul. 30, 2020

(51) Int. Cl.
*F02P 11/00* (2006.01)
*H02H 7/20* (2006.01)
(Continued)

(52) U.S. Cl.
CPC ............ *F02P 11/00* (2013.01); *H02H 1/0007* (2013.01); *H02H 7/20* (2013.01); *H03K 17/08122* (2013.01); *H03K 17/08128* (2013.01)

(58) Field of Classification Search
CPC ........... H03K 17/08–0828; F02P 11/00; H02H 9/001; H02H 7/20
See application file for complete search history.

(56) References Cited

U.S. PATENT DOCUMENTS

2006/0077000 A1   4/2006  Goudo
2011/0141651 A1   6/2011  Godo et al.
(Continued)

FOREIGN PATENT DOCUMENTS

JP    2006-109286 A    4/2006
JP    2011-127445 A    6/2011

OTHER PUBLICATIONS

International Search Report; Written Opinion; and Notification of Transmittal of The International Search Report and the Written Opinion of the International Searching Authority, or the Declaration issued in PCT/JP2018/004641; dated Mar. 13, 2018.
(Continued)

*Primary Examiner* — Jared Fureman
*Assistant Examiner* — Christopher J Clark
(74) *Attorney, Agent, or Firm* — Studebaker & Brackett PC

(57) ABSTRACT

A first clamp circuit (4) clamps a voltage between a gate and a first terminal of a switching device (Q1) to equal to or lower than a first clamp voltage. A control circuit (2) controls the switching device (Q1) and includes a driving unit (5) driving the switching device (Q1), an abnormality detecting unit (9) stopping the driving unit (5) upon detection of an abnormality in operation, and a second clamp circuit (10). The second clamp circuit (10) clamps the voltage between the gate and the first terminal to equal to or lower than a second clamp voltage which is lower than the first clamp voltage when the abnormality detecting unit (9) stops the driving unit (5).

14 Claims, 15 Drawing Sheets

(51) Int. Cl.
    *H03K 17/0812*     (2006.01)
    *H02H 1/00*     (2006.01)

(56) References Cited

U.S. PATENT DOCUMENTS

| | | | | |
|---|---|---|---|---|
| 2016/0273508 A1* | 9/2016 | Ishii | ............... | F02P 3/0442 |
| 2017/0301788 A1* | 10/2017 | Fukui | ............... | H01L 29/0661 |
| 2018/0138100 A1* | 5/2018 | Iwahashi | ............... | H01L 25/072 |

OTHER PUBLICATIONS

An Office Action; "Notice of Reasons for Refusal", mailed by the Japanese Patent Office dated May 18, 2021, which corresponds to Japanese Patent Application No. 2019-570247 and is related to U.S. Appl. No. 16/756,110; with English language translation.

An Office Action mailed by China National Intellectual Property Administration dated Jan. 4, 2022 which corresponds to Chinese Patent Application No. 201880088565.6 and is related to U.S. Appl. No. 16/756,110 with English language translation.

\* cited by examiner

SEMICONDUCTOR DEVICE

FIELD

The present disclosure relates to a semiconductor device.

BACKGROUND

In an ignition system for an internal-combustion engine such as an automobile engine, a power semiconductor device which drives an inductive load of a transformer, or the like, is used. Such a semiconductor device has a function of detecting abnormal heat generation and interrupting a principal current or a function of interrupting a principal current when an ON signal is continuously applied for equal to or longer than a fixed period of time, to avoid burnout breakdown. This interruption operation is performed for self-protection of the semiconductor device, and its timing is extremely highly likely to be different from a timing of an ignition signal of an engine control computer. There is a possibility that problems such as backfire and knocking of an engine may occur depending on the timing of the interruption operation, which may cause breakdown of an engine mechanism. To prevent this, it is necessary to realize slow interruption of a principal current, and prevent unnecessary ignition operation. To realize this, there is a method of slowly reducing a gate voltage by utilizing a high capacitor having a large time constant or by utilizing gate capacitance of an insulated gate switching device (see, for example, PTL 1).

CITATION LIST

Patent Literature

[PTL 1] JP 2011-127445 A

SUMMARY

Technical Problem

To realize slow interruption of a principal current within a control circuit, a high capacitor having a large time constant is required, which makes a size larger and increases cost. Further, in a case where gate capacitance of an insulated gate switching device is utilized, there is a problem that it is difficult to extend an interruption period if discharging is performed with a stable current by a capacitance value being made smaller, and operation becomes unstable if a current is set lower to extend an interruption period.

The present invention has been made to solve the problem as described above, and an object of the present invention is to provide a semiconductor device which is capable of stably realizing slow interruption operation of a principal current with a small size and at low cost.

Solution to Problem

A semiconductor device according to the present disclosure includes a switching device having a gate, a first terminal connected to a load, and a second terminal; a first clamp circuit clamping a voltage between the gate and the first terminal to equal to or lower than a first clamp voltage; and a control circuit controlling the switching device, wherein the control circuit includes a driving unit driving the switching device, an abnormality detecting unit stopping the driving unit upon detection of an abnormality in operation, and a second clamp circuit clamping the voltage between the gate and the first terminal to equal to or lower than a second clamp voltage which is lower than the first clamp voltage when the abnormality detecting unit stops the driving unit.

Advantageous Effects of Invention

In the present disclosure, when an abnormality in operation is detected, the voltage between the gate and the first terminal of the switching device is clamped to equal to or lower than the second clamp voltage which is lower than the first clamp voltage during normal operation. By this means, it is possible to make interruption speed slow and prevent unnecessary ignition operation without utilizing a high capacitor and gate capacitance of the switching device. Therefore, it is possible to stably realize slow interruption operation of a principal current with a small size and at low cost.

DESCRIPTION OF EMBODIMENTS

A semiconductor device according to the embodiments of the present disclosure will be described with reference to the drawings. The same components will be denoted by the same symbols, and the repeated description thereof may be omitted.

Embodiment 1

Figure 1:
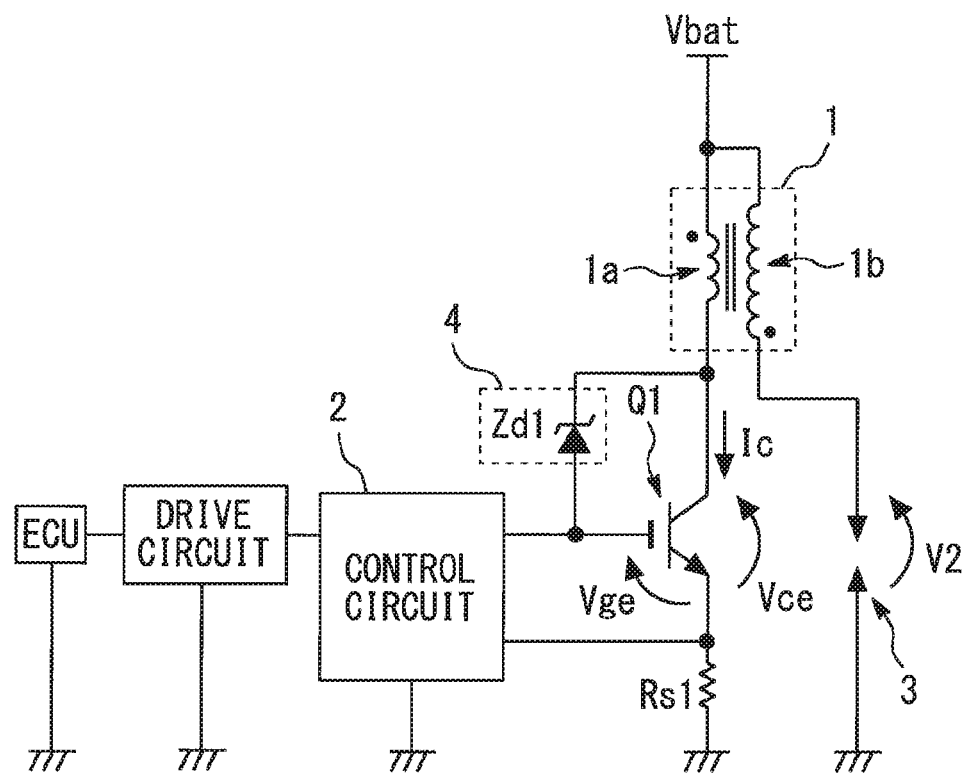
FIG. 1 is a circuit diagram illustrating a semiconductor device according to Embodiment 1.

FIG. 1 is a circuit diagram illustrating a semiconductor device according to Embodiment 1. This semiconductor device is used in an inductive ignition system for an internal-combustion engine such as an automobile engine. A power supply Vbat such as a battery is connected to one end of a primary side coil 1a and one end of a secondary side coil 1b of an ignition coil 1 which is an inductive load. The power supply voltage Vbat is 14 V. A gate of an insulated gate switching device Q1 is connected to a control circuit 2, a collector is connected to the other end of the primary side coil 1a, and an emitter is grounded via a resistor Rs1. A threshold voltage Vth of the switching device Q1 is 2 V. A resistance value of a resistor Rg1 is on the order of several tens kΩ. One end of an ignition plug 3 is connected to the other end of the secondary side coil 1b, and the other end is grounded. The control circuit 2 controls the switching device Q1 in accordance with control signals from a control computer ECU and a drive circuit.

As a first clamp circuit 4 for protection against a voltage upon normal sparking operation, a Zener diode Zd1 having a cathode connected to the collector of the switching device Q1 and an anode connected to the gate is provided. The switching device Q1 is discharged by active clamp operation in which a gate voltage is auto-biased with a leak current of Zd1. Therefore, Zd1 clamps a gate-collector voltage of the switching device Q1 to equal to or lower than a first clamp voltage. By this means, it is possible to prevent insulation breakdown of a transformer winding. Note that because the first clamp voltage is a withstand voltage of Zd1, and is large, for example, 500 V or 700 V, the first clamp voltage does not affect normal operation and interruption operation upon abnormality which will be described later.

Figure 2:
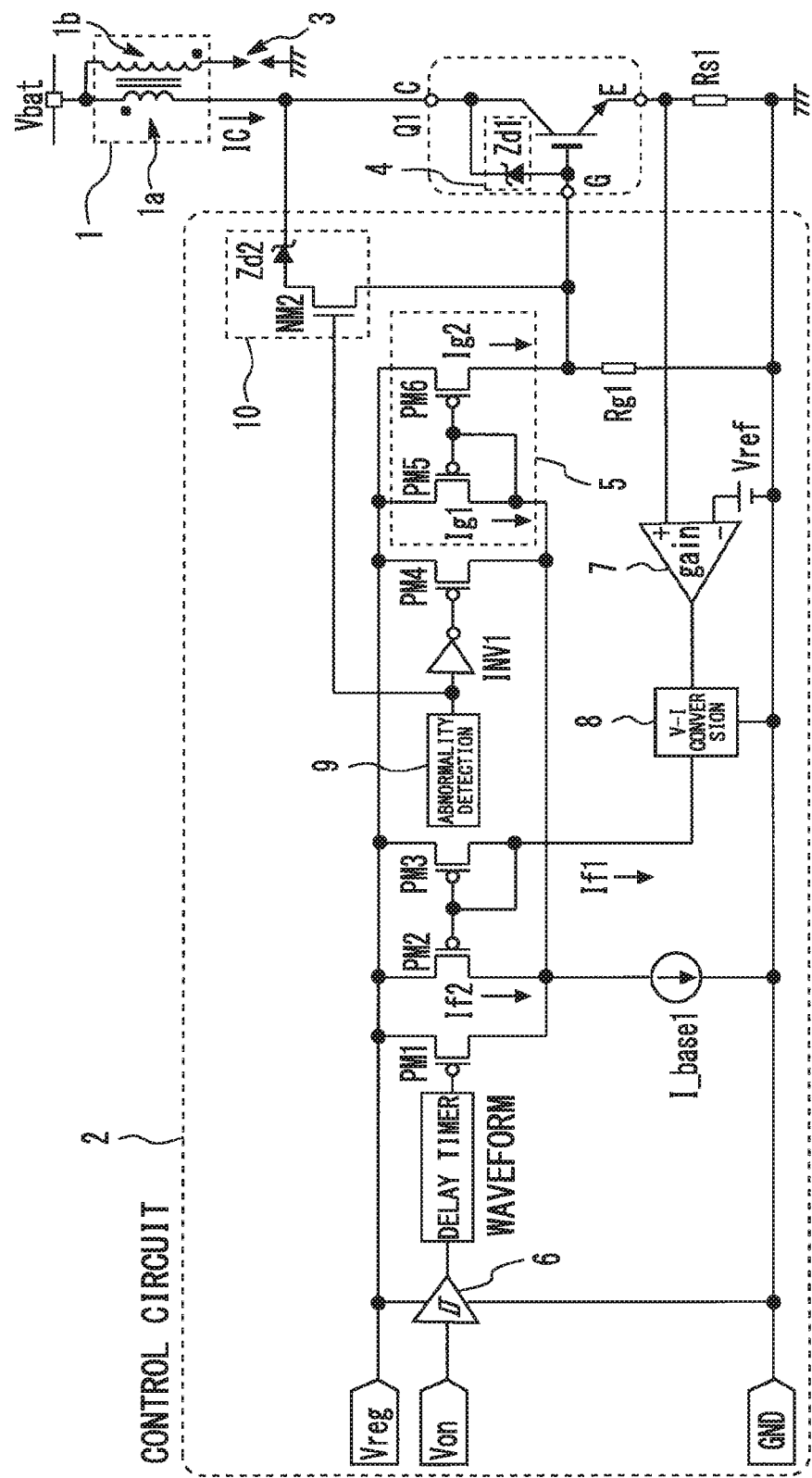
FIG. 2 is a circuit diagram illustrating a control circuit of the semiconductor device according to Embodiment 1.

FIG. 2 is a circuit diagram illustrating a control circuit of the semiconductor device according to Embodiment 1. A driving unit 5 is a current mirror circuit which is configured with PchMOS transistors PM5 and PM6, and drives the switching device Q1. The control signals input from the ECU and the drive circuit to an input terminal Von of the control circuit 2 are input to a PchMOS transistor PM1 after waveforms of the control signals are shaped by a Schmitt trigger circuit 6. As a result of PM1 being turned on or off in accordance with the control signals, a current flowing into a constant current source I_base1 changes, and thereby operation of the driving unit 5 is controlled.

A comparator 7 amplifies a difference between a reference voltage Vref and a voltage generated by a principal current Ic and the resistor Rs1. A V-I conversion circuit 8 converts an output voltage of the comparator 7 into a current If1. The current mirror circuit configured with PchMOS transistors PM2 and PM3 generates a current If2 from the current If1 in accordance with its current mirror ratio. As a result of this current If2 flowing into the constant current source I_base1, operation of the driving unit 5 is controlled. Therefore, as the principal current Ic increases, an output current Ig2 of the driving unit 5 decreases, and a voltage generated by the resistor Rg1 decreases. Negative feedback control of suppressing the principal current Ic is performed in this manner.

A PMOS transistor PM4 is connected in parallel to a PMOS transistor PM5. When an abnormality detecting unit 9 detects an abnormality such as abnormal continuous energization, the abnormality detecting unit 9 supplies a signal to PM4 via an inverter INV1 to turn on PM4. By this means, the abnormality detecting unit 9 stops the driving unit 5 upon detection of an abnormality in operation of the semiconductor device.

A second clamp circuit 10 has a Zener diode Zd2 having a cathode connected to the collector of the switching device Q1 and an anode connected to the gate, and an NchMOS transistor NM2 connected to Zd2 in series. A withstand voltage of Zd2 is 20 V, which is lower than the withstand voltage of Zd1. A withstand voltage of NM2 is higher than the withstand voltage of Zd1. NM2 is in an off state during normal operation, and, when the abnormality detecting unit 9 detects an abnormality in operation, the abnormality detecting unit 9 turns NM2 on. Therefore, because the second clamp circuit 10 operates only when the abnormality detecting unit 9 stops the driving unit 5, and does not perform clamp operation in normal times, normal operation is not affected.

Figure 3:
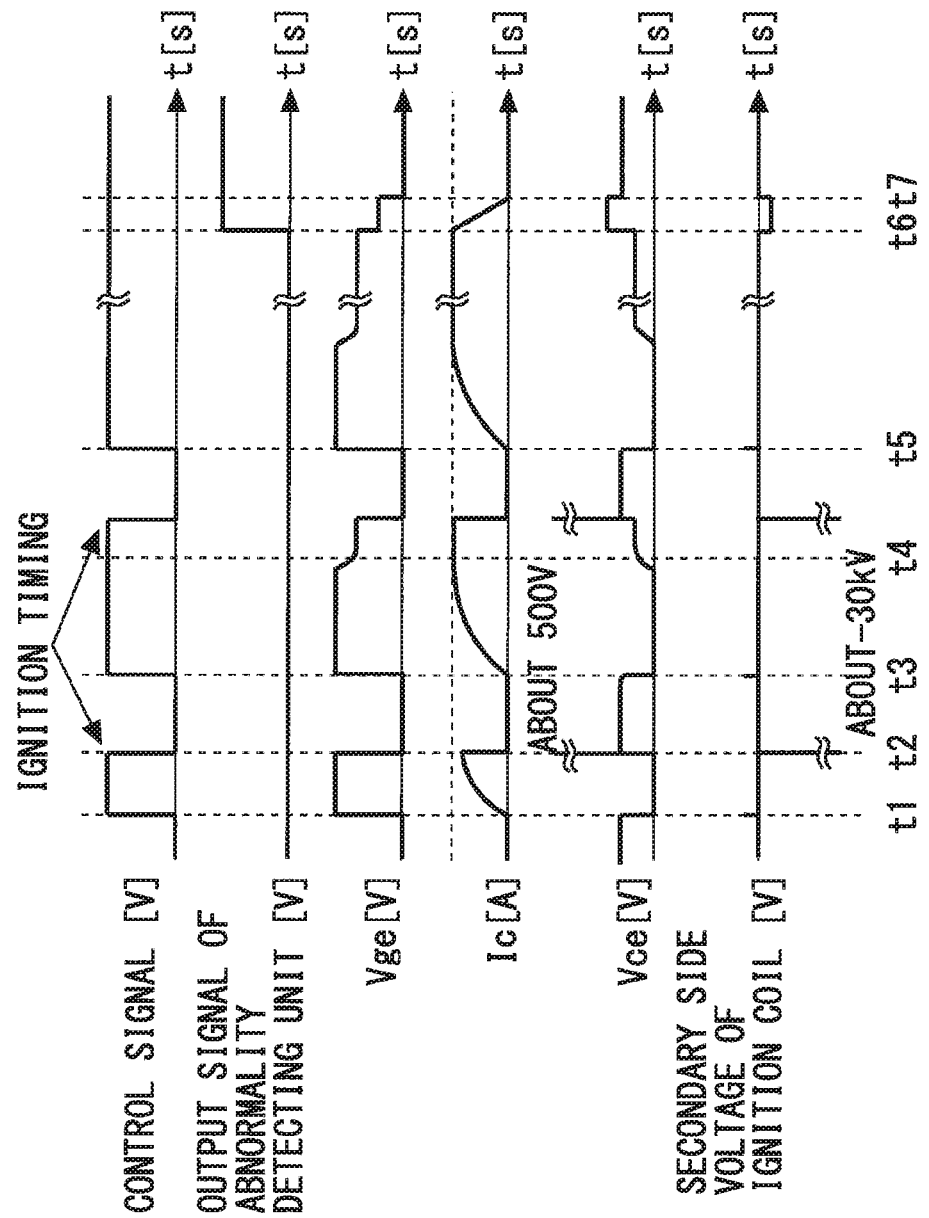
FIG. 3 is a timing chart illustrating operation of the semiconductor device according to Embodiment 1.

FIG. 3 is a timing chart illustrating operation of the semiconductor device according to Embodiment 1. When a high-level control signal is input at time t1, PM1 is turned off. Because an output signal of the abnormality detecting unit 9 is a low level during normal operation, PM4 is in an off state. By this means, a reference side current Ig1 of the current mirror circuit of the driving unit 5 flows. A current Ig2 in accordance with a mirror ratio of the current mirror circuit with respect to the reference side current Ig1 flows through the resistor Rg1. By this means, a gate voltage is generated, and the switching device Q1 is turned on. Then, the principal current Ic flows through the switching device Q1 and the primary side coil 1a in accordance with a time constant determined by wiring resistance and inductance of the primary side coil 1a.

The ECU sets the control signal at a low level at time t2 which is a timing at which it is desired to ignite a fuel. By PM1 being turned on in accordance with this, the current mirror circuit of the driving unit 5 is stopped. Because a charge accumulated at the gate of the switching device Q1 is discharged through the resistor Rg1 in a short period of time, the switching device Q1 is turned off, and the principal current Ic is interrupted. At this time, a high voltage is generated at the collector of the switching device Q1 in a direction in which a current which has flown until then is tried to continuously flow, by the primary side coil 1a. This voltage is made to rise by equal to or greater than 30 kV in accordance with a winding ratio of the ignition coil 1, and causes the ignition plug 3 connected to the secondary side coil 1b to spark.

When a high-level control signal is input for a relatively long period of time from time t3, the principal current Ic of the switching device Q1 gradually increases. A voltage in accordance with the principal current Ic is generated at the resistor Rs1. This voltage is compared with the reference voltage Vref by the comparator 7, and a current If1 in accordance with the difference is output by a V-I conversion circuit 8. This current If1 is input to the current mirror circuit configured with PM2 and PM3, and an output current in accordance with the mirror ratio is output as a current limit signal If2. A reference side current Ig1 becomes a current value obtained by subtracting the current limit signal Ig2 from an output current of the constant current source I_base1. Therefore, the current Ig2 decreases by the current limit signal If2, the gate voltage of the switching device Q1 decreases, and increase of the principal current Ic is prevented.

In this manner, the control circuit 2 has a current limitation function of detecting the principal current Ic and performing negative feedback control so that the principal current Ic does not become equal to or greater than a current limit value. The current limit value is, for example, 10 A or 14 A. By this means, it is possible to suppress fusing of the winding of the ignition coil 1 by an overcurrent, degauss of a magnet for adjusting reluctance (magnetic resistance), and magnetic saturation of a core material. Note that, because a normal energization period is approximately several milliseconds, the above-described current limitation operation is performed through energization on the order of 100 milliseconds.

At time t4, when the principal current Ic reaches the current limit value, the collector voltage is not sufficiently lowered in a state where the principal current Ic flows, and a Joule loss occurs at the switching device Q1.

From time t5, a continuous energization state which is an abnormal state occurs, and a level of the control signal continues to be high even after a timing at which the level of the control signal should originally become low, has elapsed. If this state where a Joule loss occurs continues for a long period, a chip temperature increases. Thus, it is necessary to turn off the switching device Q1 so as not to exceed an allowable loss.

For example, the abnormality detecting unit 9 judges a state as abnormal energization at time t6 at which a high level of the control signal continues for 100 to 200 milliseconds, and sets the output signal at a high level. By this means, because PM4 is turned on, this PM4 covers a supply current to the constant current source I_base1. Therefore, the current mirror circuit of the driving unit 5 is stopped, and the current Ig2 of PM6 which generates the gate voltage of the switching device Q1 becomes zero.

Further, because the abnormality detecting unit 9 turns on NM2 when the abnormality detecting unit 9 stops the driving unit 5, the Zener diode Zd2 whose withstand voltage is low is activated, and operation transitions to active clamp operation at a low voltage. That is, the second clamp circuit 10 clamps the gate-collector voltage of the switching device Q1 to equal to or lower than the second clamp voltage which is lower than the first clamp voltage.

Figure 4:
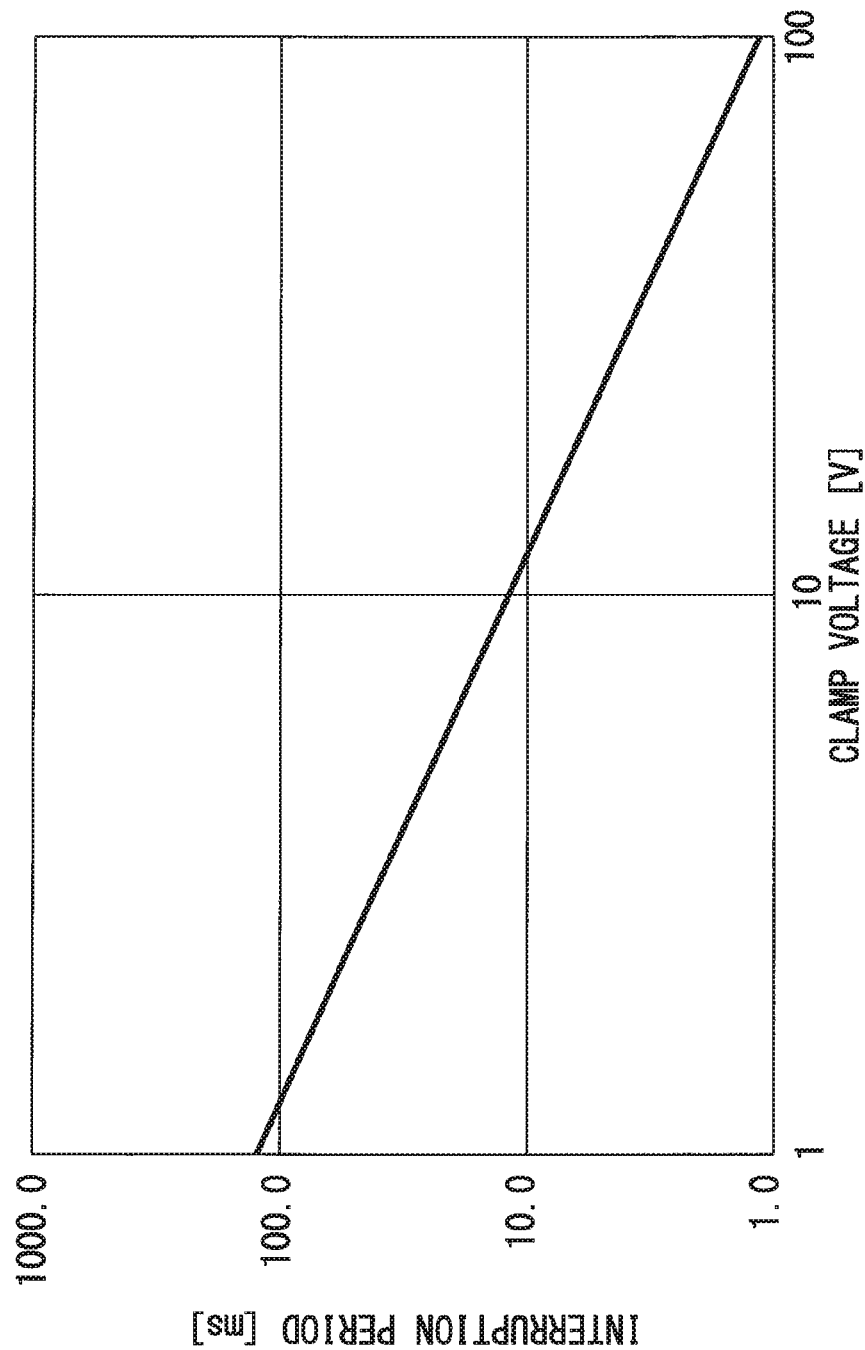
FIG. 4 is a view illustrating dependency between the clamp voltage and the interruption period.

FIG. 4 is a view illustrating dependency between the clamp voltage and the interruption period. It can be understood that as the clamp voltage between the gate and the collector of the switching device Q1 is lower, interruption speed of the switching device Q1 becomes slower. Because the generated voltage is V=Ldi/dt, and a voltage is low with fixed inductance, it is possible to stably realize slow interruption with a simple configuration.

As described above, in the present embodiment, when an abnormality in operation such as excess heat generation and an energization abnormality of the semiconductor device is detected, the gate-collector voltage of the switching device Q1 is clamped to equal to or lower than the second clamp voltage which is lower than the first clamp voltage during normal operation. By this means, it is possible to make interruption speed slow and prevent unnecessary ignition operation without utilizing a high capacitor and gate capacitance of the switching device Q1. Therefore, it is possible to stably realize slow interruption operation of a principal current with a small size and at low cost.

Embodiment 2

Figure 5:
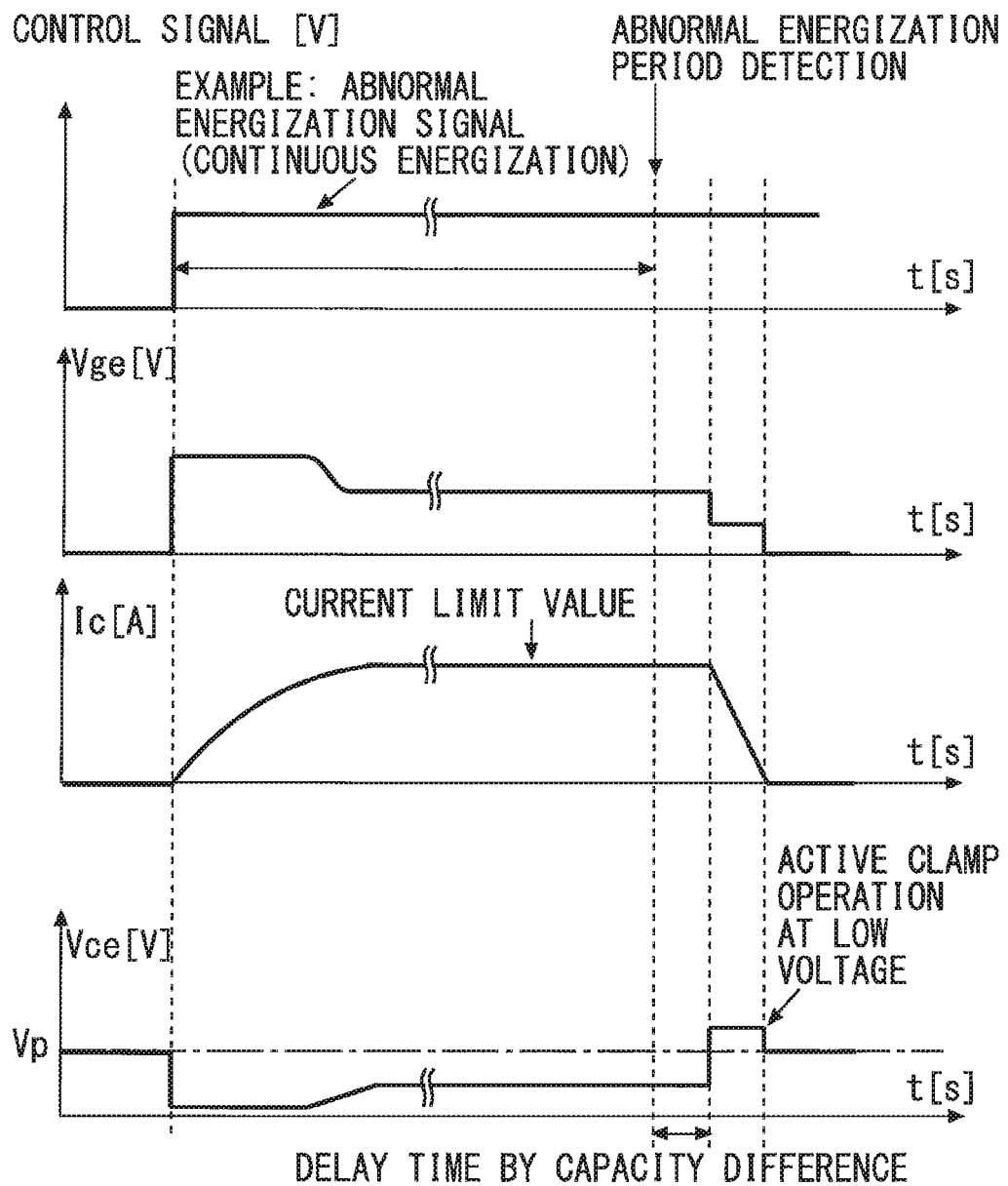
FIG. 5 is a view illustrating an operation waveform of a semiconductor device according to Embodiment 2.

FIG. 5 is a view illustrating an operation waveform of a semiconductor device according to Embodiment 2. In the present embodiment, gate capacitance of NM2 is set smaller than gate capacitance of the switching device Q1. By this means, because NM2 is turned on before the switching device Q1 is interrupted when an abnormality in operation is detected, it is possible to realize stable interruption operation of the second clamp circuit 10. Other configurations and effects are similar to those in Embodiment 1.

Embodiment 3

Figure 6:
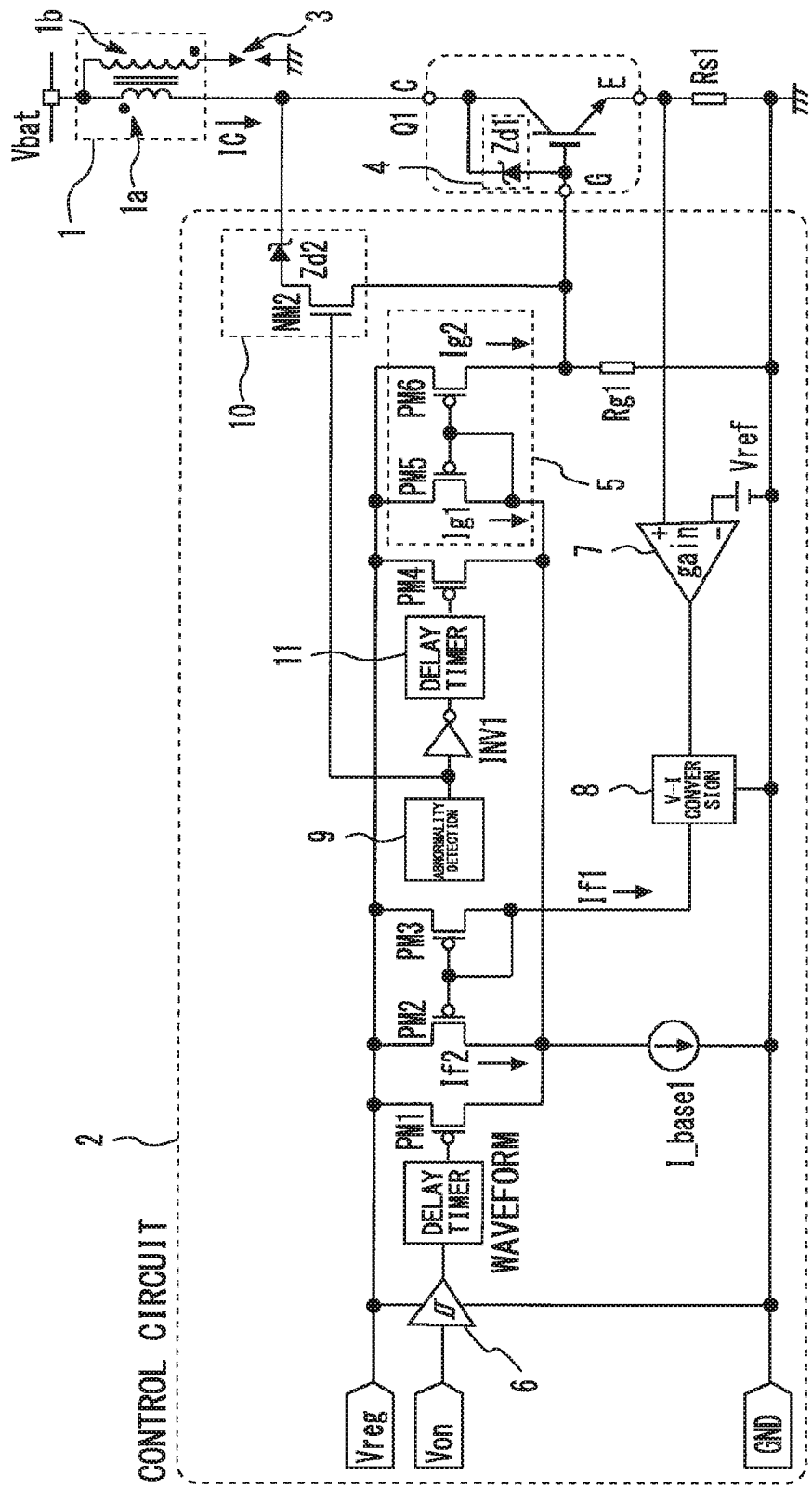
FIG. 6 is a circuit diagram illustrating a semiconductor device according to Embodiment 3.

FIG. 6 is a circuit diagram illustrating a semiconductor device according to Embodiment 3. In the present embodiment, a delay timer 11 is connected between gates of INV1 and PM4. This delay timer 11 delays a signal used by the abnormality detecting unit 9 to control the driving unit 5. By this means, because NM2 is turned on before the switching device Q1 is interrupted when an abnormality in operation is detected, it is possible to realize stable interruption operation of the second clamp circuit 10. Other configurations and effects are similar to those in Embodiment 1.

Embodiment 4

Figure 7:
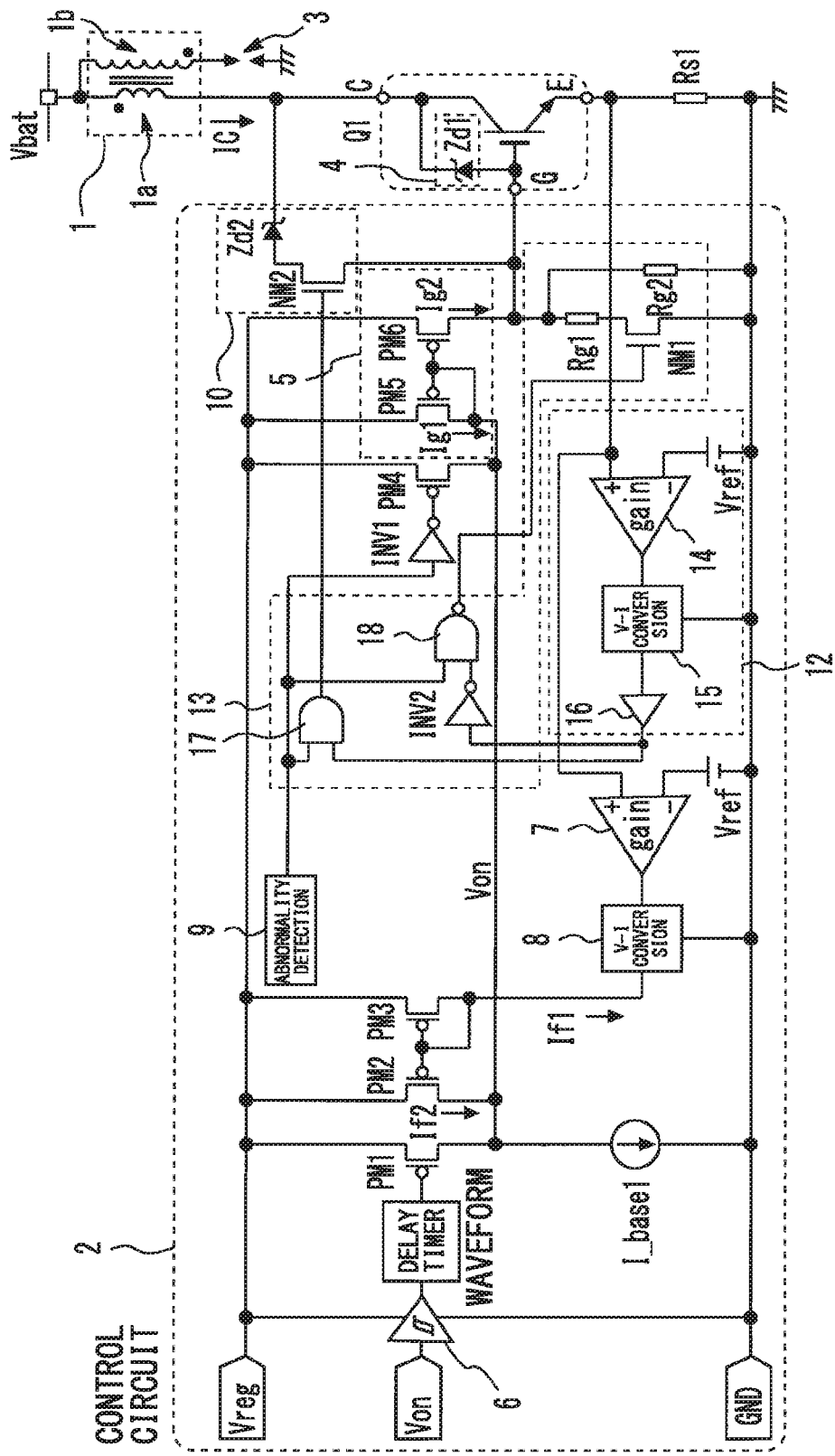
FIG. 7 is a circuit diagram illustrating a semiconductor device according to Embodiment 4.
Figure 8:
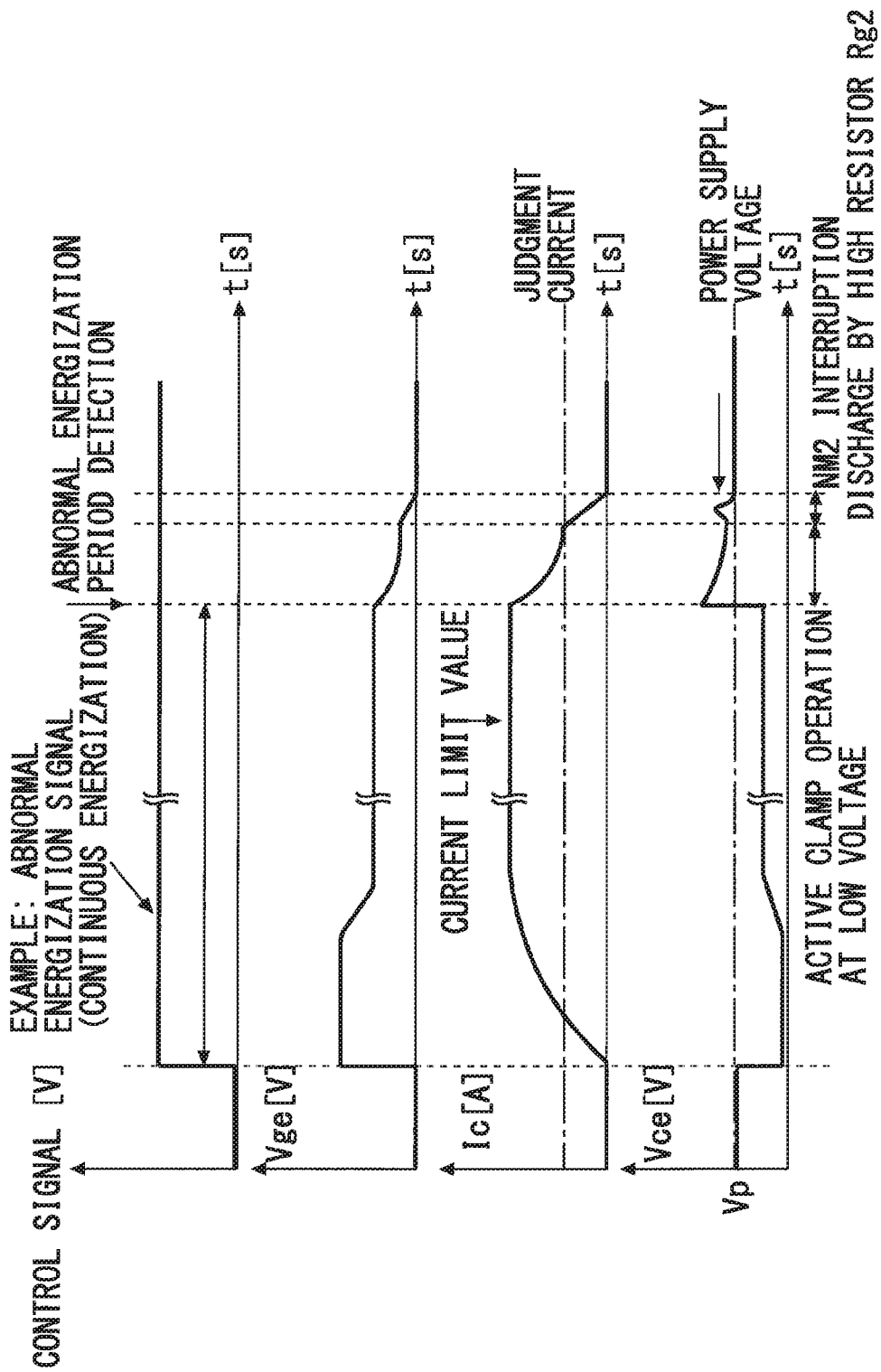
FIG. 8 is a timing chart illustrating operation of the semiconductor device according to Embodiment 4.

FIG. 7 is a circuit diagram illustrating a semiconductor device according to Embodiment 4. FIG. 8 is a timing chart illustrating operation of the semiconductor device according to Embodiment 4. In the present embodiment, a withstand voltage of Zd2 for a low-voltage active clamp is set lower than that in Embodiment 1. For example, the withstand voltage of Zd2 is set at equal to or lower than "Vbat−Vth".

The control circuit 2 further includes a current detecting unit 12 and an interruption control unit 13. The current detecting unit 12 includes a comparator 14, a V-I conversion circuit 15 and an amplifier 16. The comparator 14 amplifies a difference between the reference voltage Vref and a voltage generated by the principal current Ic and the resistor Rs1. The V-I conversion circuit 15 converts an output voltage of the comparator 14 into a current, and the amplifier 16 amplifies the current. By this means, the current detecting unit 12 detects a principal current of the switching device Q1.

The interruption control unit 13 includes an AND circuit 17, an inverter INV2, a NAND circuit 18, an nchMOS transistor NM1, and a high resistor Rg2. NM1 is connected to the resistor Rg1 in series, and the high resistor Rg2 is connected in parallel to these.

Upon forcible stop, the collector voltage rises once by the inductive load and becomes Vbat+several V to several tens V. Thereafter, while a current slowly decreases as the collector voltage decreases, a voltage of the "withstand voltage of Vbat−Zd2" is biased to the gate of the switching device Q1 if nothing is performed, and a self-biased state is caused. Therefore, if the principal current Ic falls below a fixed value, for example, 5 A after the abnormality detecting unit 9 detects an abnormality in operation, the AND circuit 17 of the interruption control unit 13 interrupts NM2 and stops active clamp operation. At the same time, the NAND circuit 18 of the interruption control unit 13 turns off NM1 and increases a resistance value between the gate of the switching device Q1 and a ground terminal. By this means, it is possible to moderately freely discharge a gate charge and slowly interrupt the principal current Ic.

Embodiment 5

Figure 9:
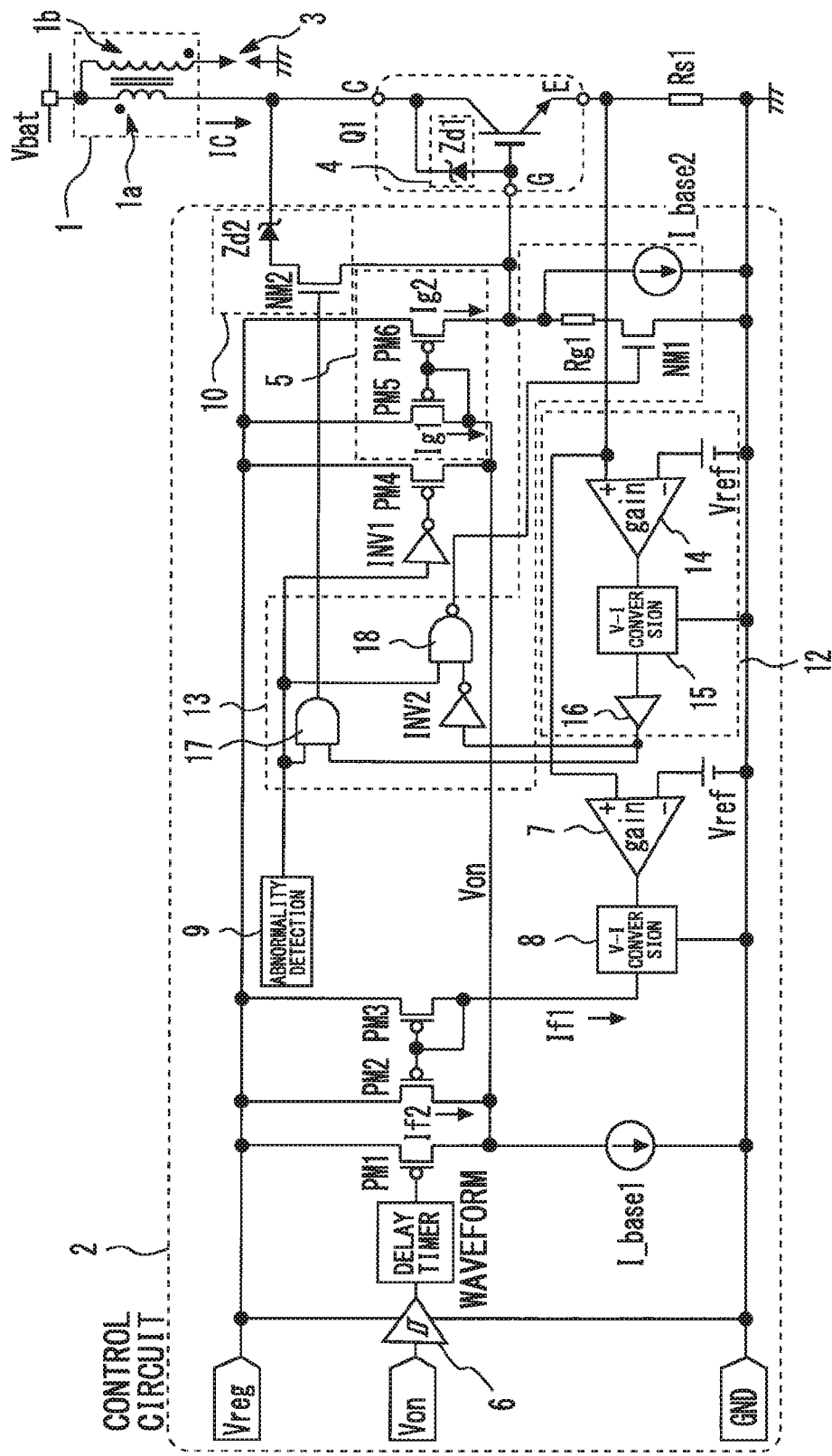
FIG. 9 is a circuit diagram illustrating a semiconductor device according to Embodiment 5.

FIG. 9 is a circuit diagram illustrating a semiconductor device according to Embodiment 5. As in Embodiment 4, if a gate charge is discharged via a resistor, discharge speed decreases in accordance with decrease in a gate voltage. Therefore, in the present embodiment, the high resistor Rg2 of the interruption control unit 13 is replaced with a constant current source I_base2. Therefore, if the principal current falls below a fixed value after the abnormality detecting unit 9 detects an abnormality in operation, the interruption control unit 13 turns off NM1 and causes a gate charge of the switching device Q1 to be discharged with a constant current. Therefore, because the discharge speed is constant, it is possible to slowly interrupt the principal current Ic.

Further, characteristic variation by semiconductor process is smaller than that in free discharge by the high resistor Rg2.

Embodiment 6

Figure 10:
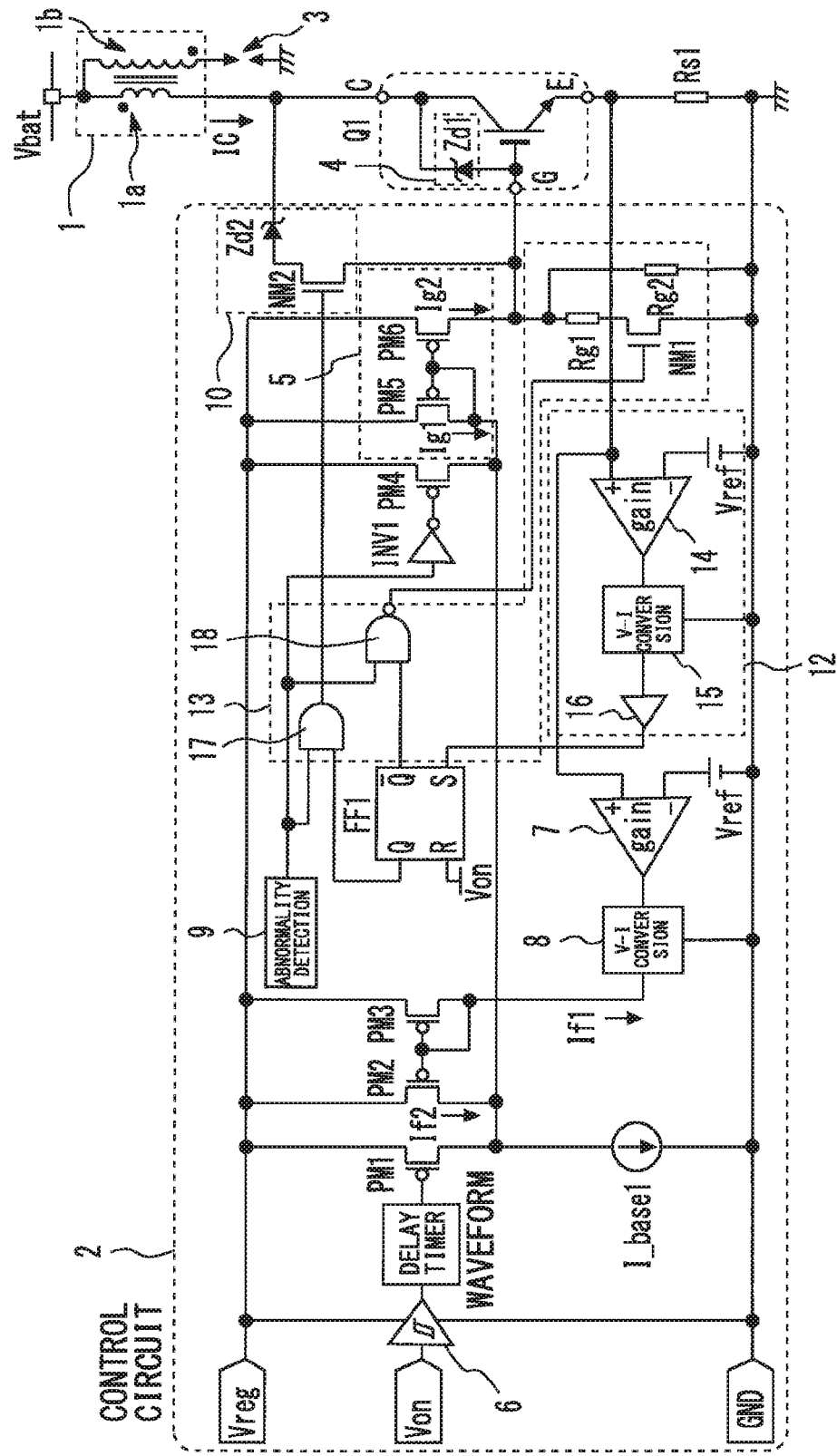
FIG. 10 is a circuit diagram illustrating a semiconductor device according to Embodiment 6.
Figure 11:
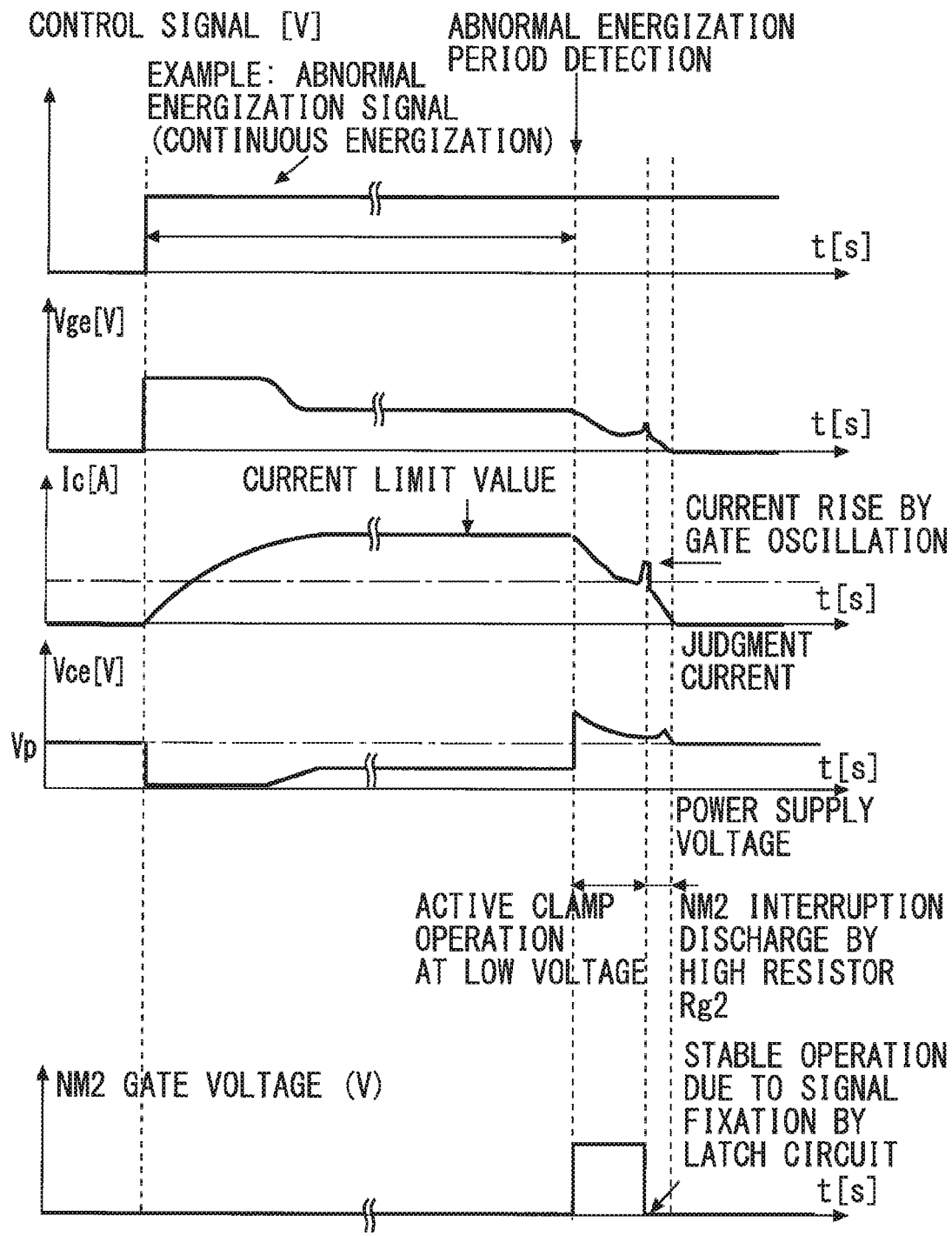
FIG. 11 is a view illustrating an operation waveform of the semiconductor device according to Embodiment 6.

FIG. 10 is a circuit diagram illustrating a semiconductor device according to Embodiment 6. FIG. 11 is a view illustrating an operation waveform of the semiconductor device according to Embodiment 6. In the present embodiment, in place of the inverter INV2, a latch circuit FF1 is connected between the current detecting unit 12 and the interruption control unit 13. By this means, even in a case where unstable operation such as current oscillation occurs upon interruption or upon current detection, the latch circuit FF1 fixes the operation. Thus, it is possible to prevent NM2 from being turned on again and it is possible to stabilize the operation. Note that, by a reset signal of the latch circuit FF1 being used as an off signal from the ECU, it is possible to avoid unstable operation. Other configurations and effects are similar to those in Embodiment 4.

Embodiment 7

Figure 12:
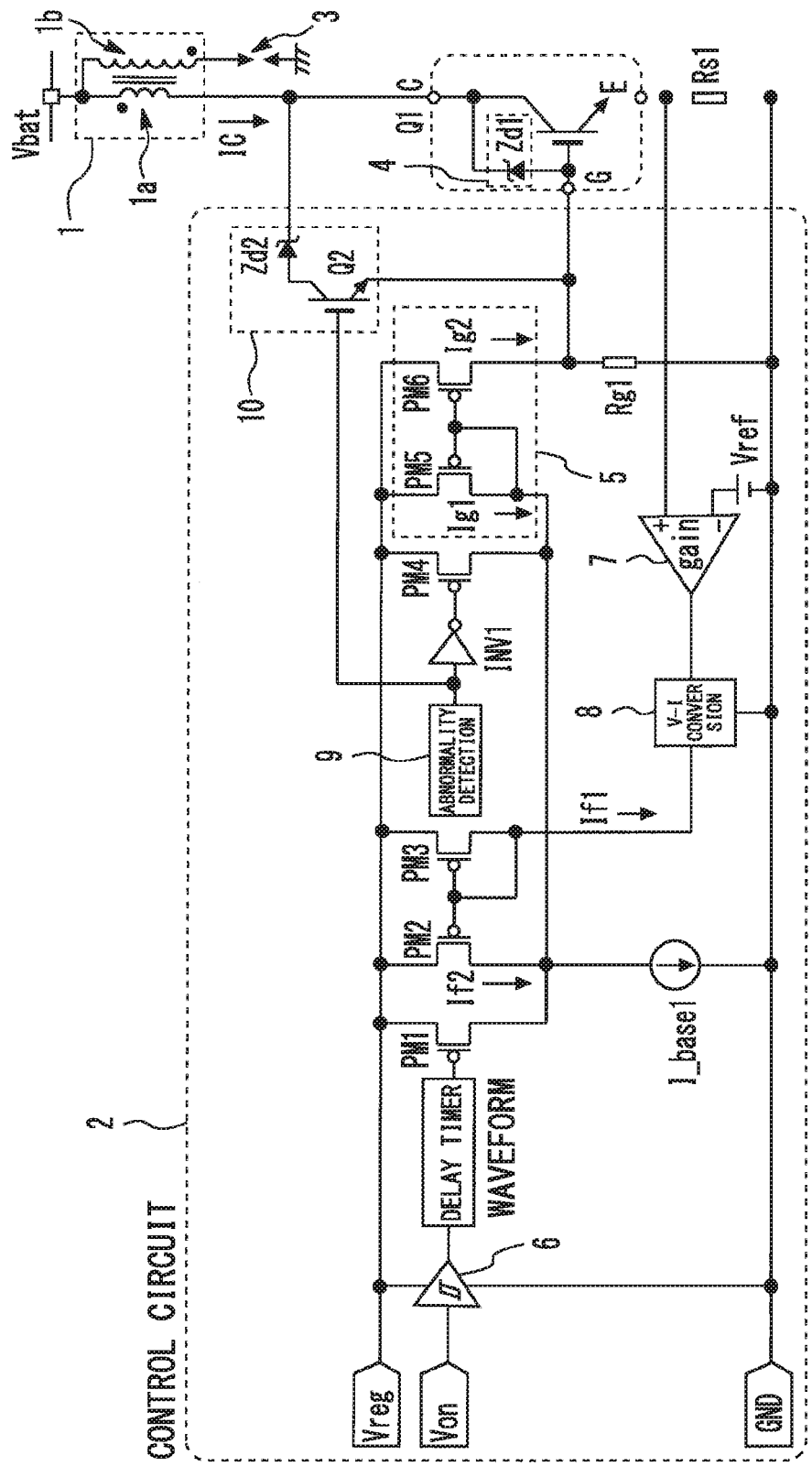
FIG. 12 is a circuit diagram illustrating a semiconductor device according to Embodiment 7.

FIG. 12 is a circuit diagram illustrating a semiconductor device according to Embodiment 7. In the present embodiment, in place of NM2, a vertical insulated gate transistor Q2 is used. In a case where Q2 which withstands a high voltage is formed within the same chip as other components of the control circuit 2, a region for securing a withstand voltage between a drain and a source becomes unnecessary, so that it is possible to make a device smaller and reduce cost by shortening wirings. Further, also in a case where Q2 is provided as an external element, it is possible to reduce cost by reducing members and reducing wirings. Other configurations and effects are similar to those in Embodiment 1.

Embodiment 8

Figure 13:
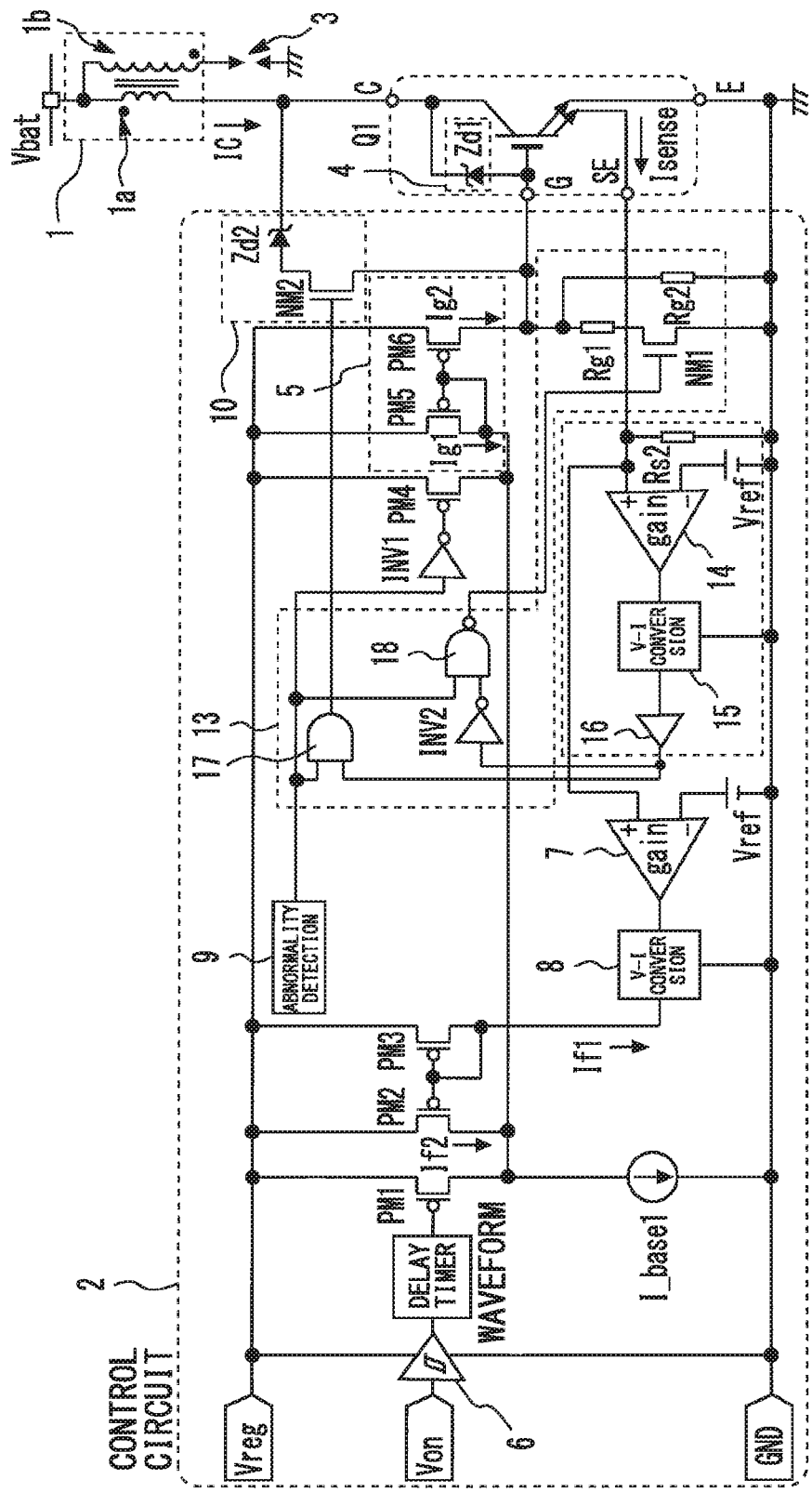
FIG. 13 is a circuit diagram illustrating a semiconductor device according to Embodiment 8.

FIG. 13 is a circuit diagram illustrating a semiconductor device according to Embodiment 8. In the present embodiment, as the switching device Q1, an insulated gate switching device for a small sense is used. To detect the principal current Ic, this switching device Q1 has a sense emitter through which a sense current Isense of, for example, approximately 1/1000 proportional to the principal current Ic flows. The current detecting unit 12 then detects the principal current Ic from the sense current Isense and a sense resistor Rs2 within the control circuit 2. Therefore, it is possible to omit the resistor Rs1 from the emitter side of the switching device Q1 through which much current flows. Therefore, it is possible to reduce cost and realize a smaller size by shortening wirings and reducing members. Further, because voltage drop by the detection resistor Rs1 does not occur, it is possible to prevent decrease of the gate voltage of the switching device Q1. Other configurations and effects are similar to those in Embodiment 4.

Embodiment 9

Figure 14:
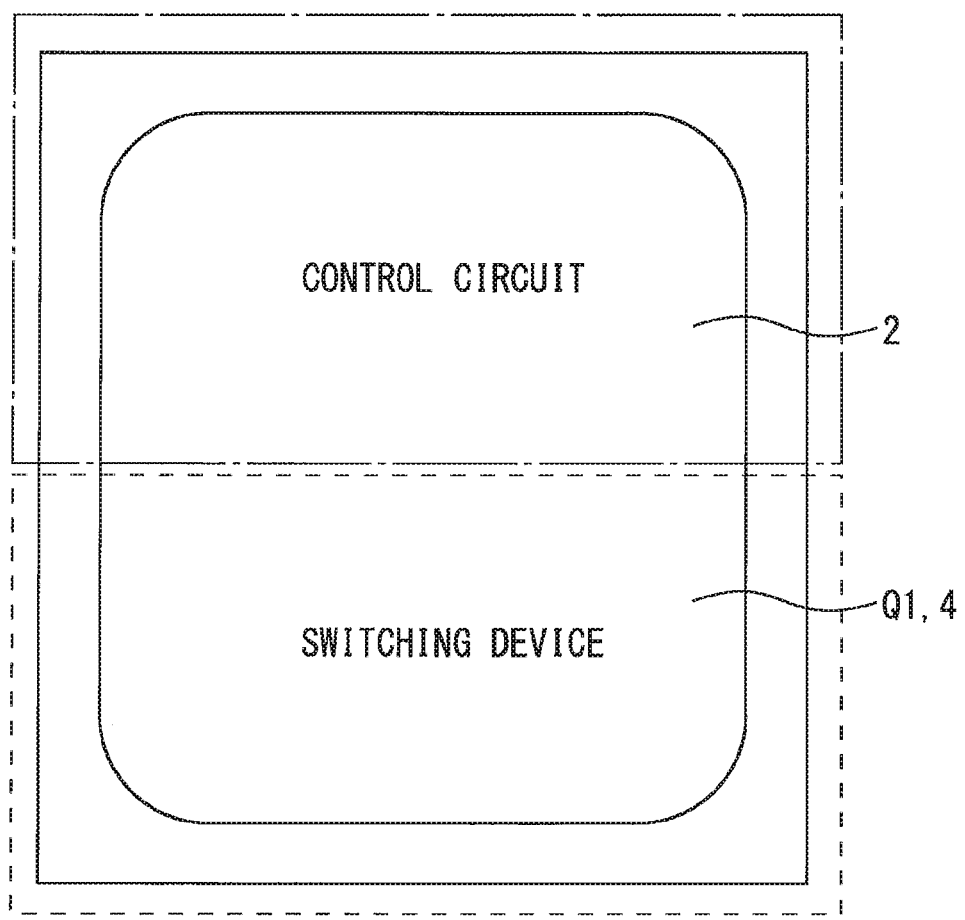
FIG. 14 is a plan view illustrating a semiconductor device according to Embodiment 9.

FIG. 14 is a plan view illustrating a semiconductor device according to Embodiment 9. In the present embodiment, the switching device Q1, the first clamp circuit 4 and the control circuit 2 are formed in one chip. By this means, it is possible to reduce wires and reduce assembly processes, so that it is possible to realize a smaller size and reduce cost. Other configurations and effects are similar to those in Embodiments 1 to 8.

Embodiment 10

Figure 15:
FIG. 15 is a circuit diagram illustrating a semiconductor device according to Embodiment 10.

FIG. 15 is a circuit diagram illustrating a semiconductor device according to Embodiment 10. While the switching device Q1 in Embodiments 1 to 9 is a Si-IGBT formed with silicon, the switching device Q1 in the present embodiment is a SiC-MOSFET. The switching device Q1 is not limited to a device formed of silicon, but instead may be formed of a wide-bandgap semiconductor having a bandgap wider than that of silicon. The wide-bandgap semiconductor is, for example, a silicon carbide, a gallium-nitride-based material, or diamond. A switching device Q1 formed of such a wide-bandgap semiconductor has a high voltage resistance and a high allowable current density, and thus can be miniaturized. The use of such a miniaturized device enables the miniaturization and high integration of the semiconductor device in which the device is incorporated. Further, since the device has a high heat resistance, a radiation fin of a heatsink can be miniaturized and a water-cooled part can be air-cooled, which leads to further miniaturization of the semiconductor device. Further, since the device has a low power loss and a high efficiency, a highly efficient semiconductor device can be achieved.

REFERENCE SIGNS LIST 2 control circuit; 4 first clamp circuit; 5 driving unit; 9 abnormality detecting unit; 10 second clamp circuit; 11 delay timer; 12 current detecting unit; 13 interruption control unit; FF1 latch circuit; NM2 transistor; Q1 switching device; Zd2 Zener diode

The invention claimed is:

1. A semiconductor device comprising:
   a switching device having a gate, a first terminal connected to a load, and a second terminal;
   a first clamp circuit clamping a voltage between the gate and the first terminal to equal to or lower than a first clamp voltage; and
   a control circuit controlling the switching device,
   wherein the control circuit includes
   a driving unit driving the switching device,
   an abnormality detecting unit stopping the driving unit upon detection of an abnormality in operation, and
   a second clamp circuit clamping the voltage between the gate and the first terminal to equal to or lower than a second clamp voltage which is lower than the first clamp voltage when the abnormality detecting unit stops the driving unit,
   wherein
   the second clamp circuit includes a Zener diode and a transistor connected to the Zener diode in series, and
   gate capacitance of the transistor is smaller than gate capacitance of the switching device.

2. The semiconductor device according to claim 1, wherein the Zener diode has a cathode connected to the first terminal and an anode connected to the gate, and
   the abnormality detecting unit turns on the transistor upon detection of the abnormality in operation.

3. The semiconductor device according to claim 2, further comprising a delay timer delaying a signal used by the abnormality detecting unit to control the driving unit.

4. The semiconductor device according to claim 2, wherein the control circuit includes
   a current detecting unit detecting a principal current of the switching device, and
   an interruption control unit turning off the transistor and increasing a resistance value between the gate of the switching device and a ground terminal when the principal current falls below a fixed value after the abnormality detecting unit detects the abnormality in operation.

5. The semiconductor device according to claim 4, wherein the control circuit includes a latch circuit connected between the current detecting unit and the interruption control unit.

6. The semiconductor device according to claim 4, wherein the current detecting unit detects the principal current from a sense current of the switching device.

7. The semiconductor device according to claim 2, wherein the control circuit includes
   a current detecting unit detecting a principal current of the switching device, and
   an interruption control unit turning off the transistor and causing a gate charge of the switching device to be discharged with a constant current when the principal current falls below a fixed value after the abnormality detecting unit detects the abnormality in operation.

8. The semiconductor device according to claim 2, wherein the transistor is a vertical insulated gate transistor.

9. The semiconductor device according to claim 1, wherein the switching device, the first clamp circuit and the control circuit are formed in one chip.

10. The semiconductor device according to claim 1, wherein the switching device is formed of a wide-bandgap semiconductor.

11. A semiconductor device comprising:
    a switching device having a gate, a first terminal connected to a load, and a second terminal;
    a first clamp circuit clamping a voltage between the gate and the first terminal to equal to or lower than a first clamp voltage; and
    a control circuit controlling the switching device,
    wherein the control circuit includes
    a driving unit driving the switching device,
    an abnormality detecting unit stopping the driving unit upon detection of an abnormality in operation, and
    a second clamp circuit clamping the voltage between the gate and the first terminal to equal to or lower than a second clamp voltage which is lower than the first clamp voltage when the abnormality detecting unit stops the driving unit,
    wherein
    the second clamp circuit includes a Zener diode having a cathode connected to the first terminal and an anode connected to the gate, and a transistor connected to the Zener diode in series,
    the abnormality detecting unit turns on the transistor upon detection of the abnormality in operation, and
    the control circuit includes
    a current detecting unit detecting a principal current of the switching device, and
    an interruption control unit turning off the transistor and increasing a resistance value between the gate of the switching device and a ground terminal when the principal current falls below a fixed value after the abnormality detecting unit detects the abnormality in operation.

12. The semiconductor device according to claim 11, wherein the control circuit includes a latch circuit connected between the current detecting unit and the interruption control unit.

13. The semiconductor device according to claim 11, wherein the current detecting unit detects the principal current from a sense current of the switching device.

14. A semiconductor device comprising:
    a switching device having a gate, a first terminal connected to a load, and a second terminal;
    a first clamp circuit clamping a voltage between the gate and the first terminal to equal to or lower than a first clamp voltage; and
    a control circuit controlling the switching device,
    wherein the control circuit includes
    a driving unit driving the switching device,
    an abnormality detecting unit stopping the driving unit upon detection of an abnormality in operation, and
    a second clamp circuit clamping the voltage between the gate and the first terminal to equal to or lower than a second clamp voltage which is lower than the first clamp voltage when the abnormality detecting unit stops the driving unit,
    wherein
    the second clamp circuit includes a Zener diode having a cathode connected to the first terminal and an anode connected to the gate, and a transistor connected to the Zener diode in series,
    the abnormality detecting unit turns on the transistor upon detection of the abnormality in operation, and
    the control circuit includes
    a current detecting unit detecting a principal current of the switching device, and
    an interruption control unit turning off the transistor and causing a gate charge of the switching device to be discharged with a constant current when the principal current falls below a fixed value after the abnormality detecting unit detects the abnormality in operation.

* * * * *